(12) United States Patent
Okada

(10) Patent No.: US 8,199,313 B2
(45) Date of Patent: Jun. 12, 2012

(54) TEMPERATURE REGULATING APPARATUS, EXPOSURE APPARATUS, AND DEVICE MANUFACTURING METHOD

(75) Inventor: Yoshiyuki Okada, Sakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 469 days.

(21) Appl. No.: 12/212,207

(22) Filed: Sep. 17, 2008

(65) Prior Publication Data

US 2009/0090498 A1    Apr. 9, 2009

(30) Foreign Application Priority Data

Oct. 4, 2007    (JP) ................. 2007-261248

(51) Int. Cl.
*G03B 27/52* (2006.01)
*G03B 27/42* (2006.01)
(52) U.S. Cl. .................. 355/30; 355/53
(58) Field of Classification Search ........ 355/53, 355/30; 165/201, 299
See application file for complete search history.

(56) References Cited

U.S. PATENT DOCUMENTS

| | | | |
|---|---|---|---|
| 5,335,708 A | 8/1994 | Murakami et al. | 165/1 |
| 6,418,748 B1 * | 7/2002 | Kramer | 62/434 |
| 6,995,828 B2 | 2/2006 | Okada | 355/30 |
| 7,164,464 B2 | 1/2007 | Okada | 355/53 |
| 2004/0035851 A1 * | 2/2004 | Antoniou et al. | 219/509 |
| 2006/0005554 A1 | 1/2006 | Okada | 62/183 |
| 2007/0013895 A1 | 1/2007 | Okada | 355/72 |
| 2007/0085986 A1 | 4/2007 | Okada | 355/30 |
| 2008/0062391 A1 | 3/2008 | Uchida et al. | 355/52 |

FOREIGN PATENT DOCUMENTS

| | | |
|---|---|---|
| JP | 3-102153 | 4/1991 |
| JP | 2006-31113 | 2/2006 |

* cited by examiner

*Primary Examiner* — Edward Glick
*Assistant Examiner* — Deoram Persaud
(74) *Attorney, Agent, or Firm* — Fitzpatrick, Cella, Harper & Scinto

(57) ABSTRACT

A temperature regulating apparatus includes a heat exchanger and regulates a temperature of a first medium by performing heat exchange between the first medium and a second medium via the heat exchanger. A regulating operation unit generates a flow rate regulating signal so that the temperature of the first medium flowing out from a primary side outlet of the heat exchanger becomes equal to a target temperature. A control valve regulates a flow rate of the second medium based on the flow rate regulating signal. A correcting operation unit (a) calculates, based on temperatures detected by first, second, third and fourth temperature sensors, a heat exchange amount of the heat exchanger, a logarithmic mean temperature difference or an average temperature in the heat exchanger, and the flow rate of the second medium, (b) calculates an overall heat transfer coefficient of the heat exchanger based on the calculated heat exchange amount and the calculated logarithmic mean temperature difference or the calculated average temperature, and the flow rate of the second medium, (c) obtains a ratio ($\Delta G$) of a change (Q2-Q'2) in the heat exchange amount to a change ($\Delta F2$) in the flow rate of the second medium based on the calculated flow rate (F2) of the second medium and the calculated overall heat transfer coefficient (K), and (d) corrects a gain of the regulating operation unit based on the obtained ratio.

10 Claims, 11 Drawing Sheets

FIG. 4

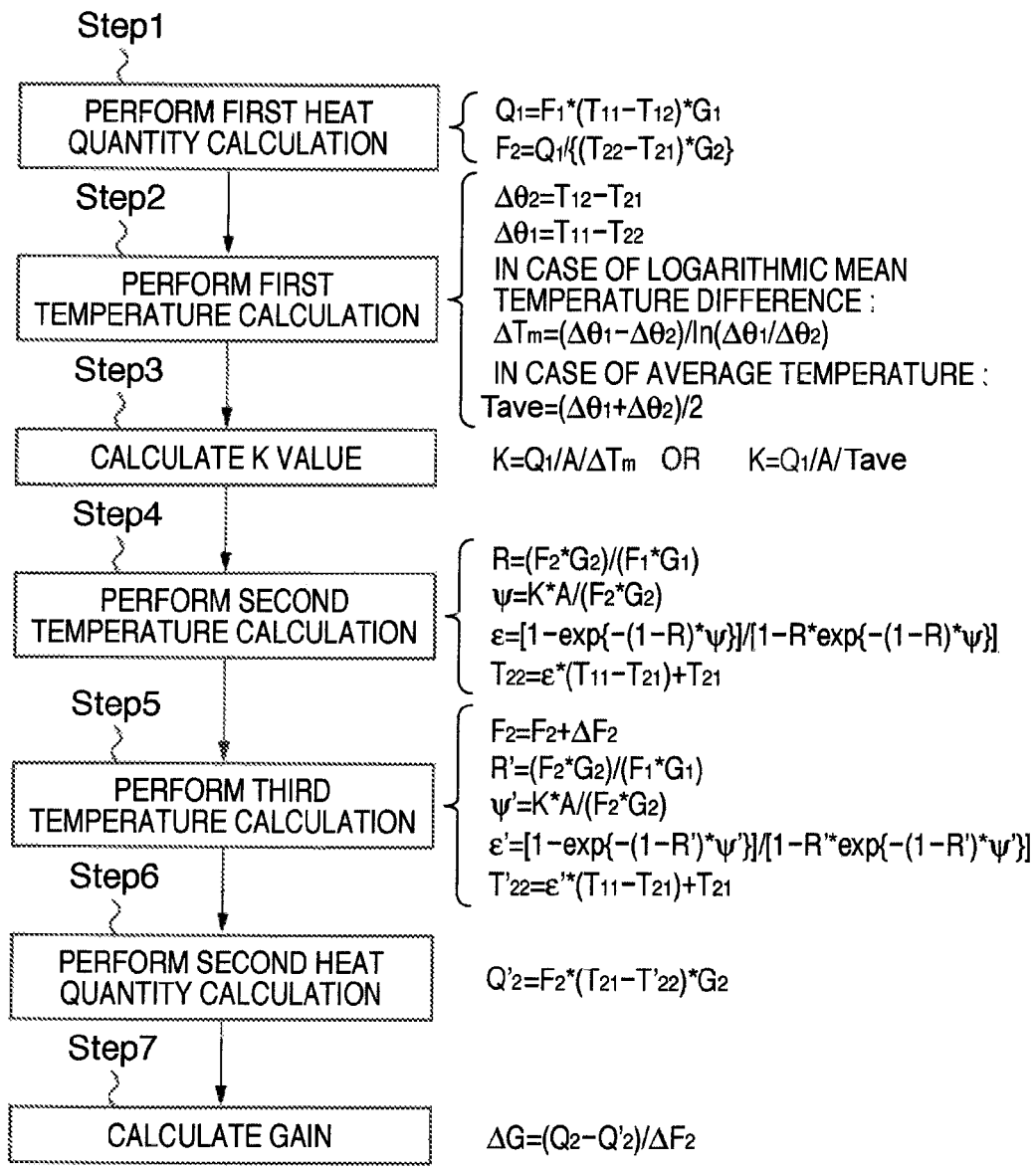

Step1: PERFORM FIRST HEAT QUANTITY CALCULATION
$Q_1 = F_1 * (T_{11} - T_{12}) * G_1$
$F_2 = Q_1 / \{(T_{22} - T_{21}) * G_2\}$

Step2: PERFORM FIRST TEMPERATURE CALCULATION
$\Delta\theta_2 = T_{12} - T_{21}$
$\Delta\theta_1 = T_{11} - T_{22}$
IN CASE OF LOGARITHMIC MEAN TEMPERATURE DIFFERENCE:
$\Delta T_m = (\Delta\theta_1 - \Delta\theta_2)/\ln(\Delta\theta_1/\Delta\theta_2)$
IN CASE OF AVERAGE TEMPERATURE:
$T_{ave} = (\Delta\theta_1 + \Delta\theta_2)/2$

Step3: CALCULATE K VALUE
$K = Q_1/A/\Delta T_m$ OR $K = Q_1/A/T_{ave}$

Step4: PERFORM SECOND TEMPERATURE CALCULATION
$R = (F_2 * G_2)/(F_1 * G_1)$
$\psi = K * A/(F_2 * G_2)$
$\varepsilon = [1 - \exp\{-(1-R)*\psi\}]/[1 - R*\exp\{-(1-R)*\psi\}]$
$T_{22} = \varepsilon * (T_{11} - T_{21}) + T_{21}$

Step5: PERFORM THIRD TEMPERATURE CALCULATION
$F_2 = F_2 + \Delta F_2$
$R' = (F_2 * G_2)/(F_1 * G_1)$
$\psi' = K * A/(F_2 * G_2)$
$\varepsilon' = [1 - \exp\{-(1-R')*\psi'\}]/[1 - R'*\exp\{-(1-R')*\psi'\}]$
$T'_{22} = \varepsilon' * (T_{11} - T_{21}) + T_{21}$

Step6: PERFORM SECOND HEAT QUANTITY CALCULATION
$Q'_2 = F_2 * (T_{21} - T'_{22}) * G_2$

Step7: CALCULATE GAIN
$\Delta G = (Q_2 - Q'_2)/\Delta F_2$

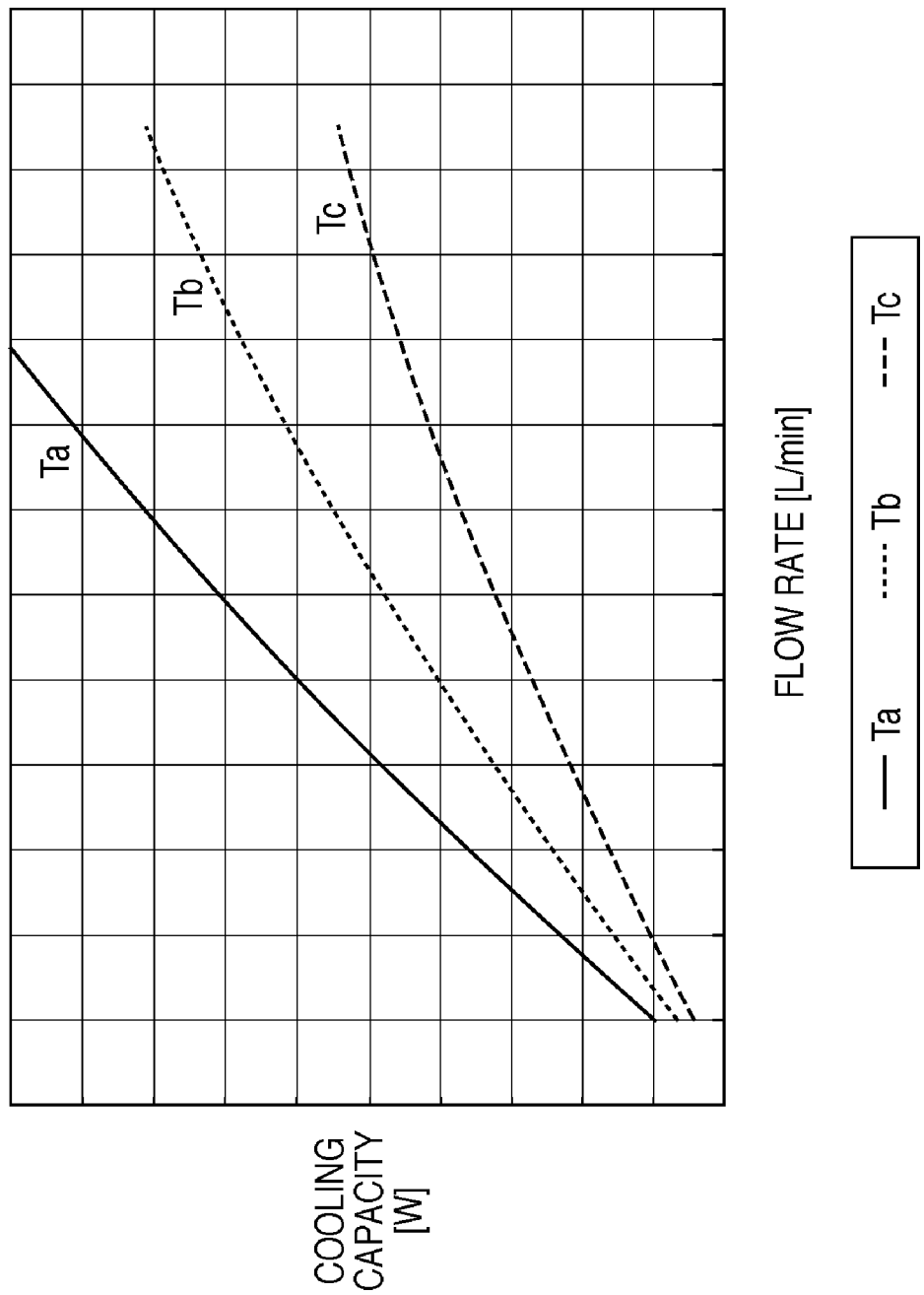

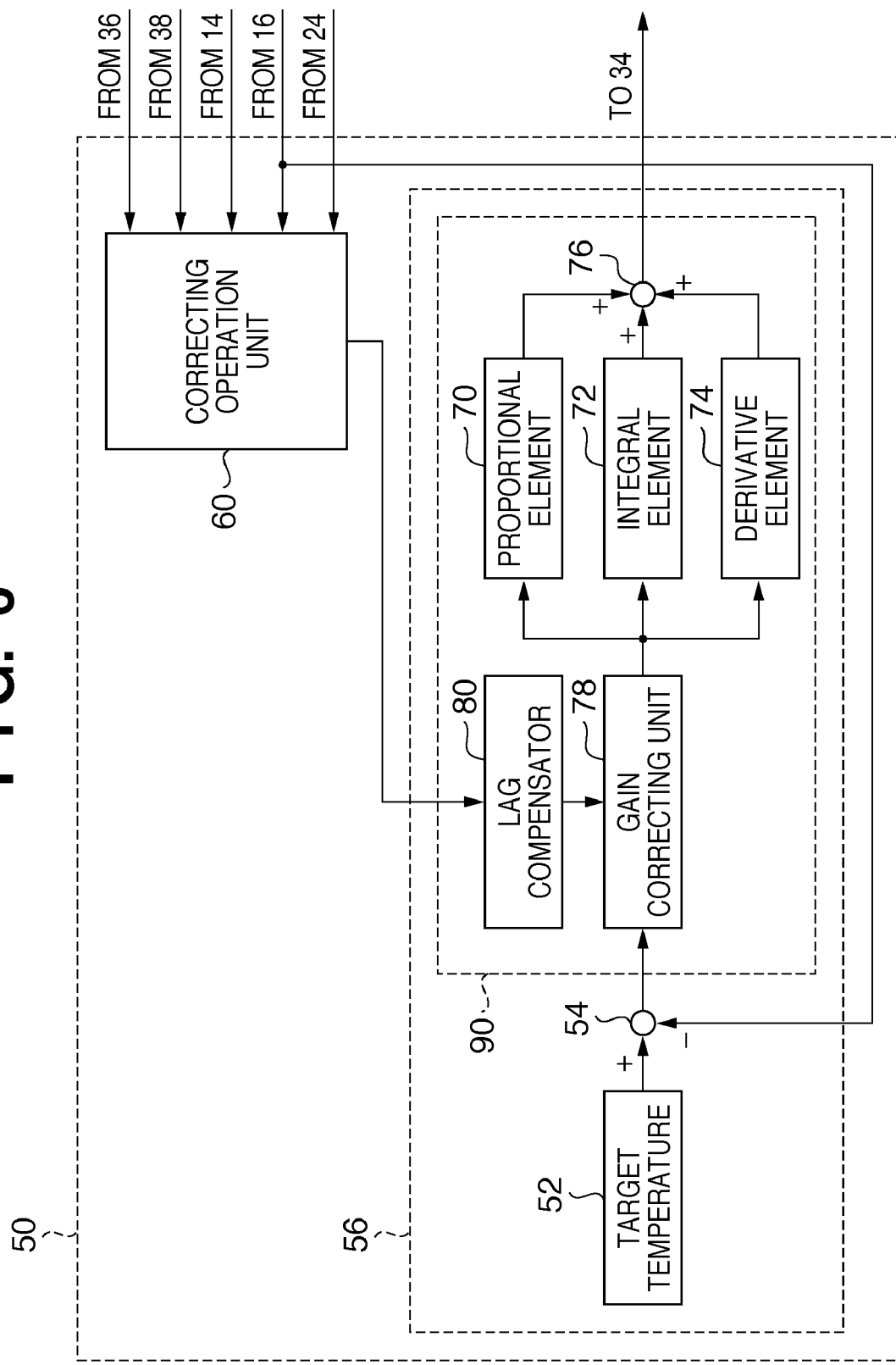

though that comes out from the
TEMPERATURE REGULATING APPARATUS, EXPOSURE APPARATUS, AND DEVICE MANUFACTURING METHOD This application claims the benefit of Japanese Patent Application No. 2007-261248, filed Oct. 4, 2007, which is hereby incorporated by reference herein in its entirety.

BACKGROUND OF THE INVENTION

Field of the Invention

The present invention relates to a temperature regulating apparatus that regulates the temperature of a first medium by performing heat exchange between the first medium and a second medium via a heat exchanger, an exposure apparatus including the temperature regulating apparatus, and a method of manufacturing a device using the exposure apparatus.

Description of the Related Art

Recently, an exposure apparatus for manufacturing devices, such as semiconductor devices, has been required to have high productivity. Along with this requirement, the power consumption tends to increase. On the other hand, device patterns to be formed decrease in size more and more, and hence, it is necessary to maintain the environment in the exposure apparatus more stably. With an increase in power consumption, in particular, a temperature regulating apparatus having high efficiency and very high temperature stability is required.

Some systems, which regulate the temperature of an apparatus having a heat-generating load by using a refrigerant, are based on a scheme of regulating the temperature of the refrigerant to a target temperature by regulating the flow rate of factory cooling water to a heat exchanger for performing heat exchange between the factory cooling water and the refrigerant. In this scheme, fluctuations in the temperature of the factory cooling water sometimes raise a problem. Japanese Patent Laid-Open No. 3-120153 discloses a technique of reducing the influence of such a problem. Japanese Patent Laid-Open No. 2006-031113 discloses a technique based on the consideration of changes in the overall heat transfer coefficient of a heat exchanger due to fluctuations in the flow rate of cooling water in addition to fluctuations in the temperature of factory cooling water.

According to Japanese Patent Laid-Open No. 3-102153, the degree of opening of a control valve that regulates the flow rate of cooling water is changed based on the difference between the target temperature of a refrigerant and the temperature of a refrigerant at the outlet of a heat exchanger, and the difference between the temperature of the refrigerant at the outlet of the heat exchanger and the temperature of cooling water at the inlet of the heat exchanger. However, the '153 document has no description about a specific method of determining the degree of opening of the control valve.

Japanese Patent Laid-Open No. 2006-031113 discloses a method of calculating the flow rate of cooling water necessary for heat exchange based on the target temperature of a refrigerant, the temperature of the refrigerant at the inlet of a heat exchanger, the temperature of cooling water at the inlet of the heat exchanger, and the overall heat transfer coefficient of the heat exchanger, and regulating the temperature of the refrigerant by regulating a control valve based on the flow rate. In this method, since the overall heat transfer coefficient of the heat exchanger changes in accordance with the flow rate of the cooling water, an overall heat transfer coefficient characteristic with respect to the flow rate of the cooling water is measured or calculated in advance, and a correction is made in accordance with the flow rate of the cooling water. However, the overall heat transfer coefficient also changes due to stains, or the like, in the heat exchanger, and the value of the overall heat transfer coefficient may change due to long-term use.

SUMMARY OF THE INVENTION

The present invention has been made in consideration of the above background, and has as its exemplary object to provide a temperature regulating apparatus that performs stable temperature regulation and its application example.

According to a first aspect, the present invention provides a temperature regulating apparatus that includes a heat exchanger and regulates a temperature of a first medium by performing heat exchange between the first medium and a second medium via the heat exchanger, the apparatus comprising a first temperature sensor configured to detect a temperature of the first medium flowing out from a primary side outlet of the heat exchanger, a second temperature sensor configured to detect a temperature of the first medium flowing into a primary side inlet of the heat exchanger, a third temperature sensor configured to detect a temperature of the second medium flowing into a secondary side inlet of the heat exchanger, a fourth temperature sensor configured to detect a temperature of the second medium flowing out from a secondary side outlet of the heat exchanger, a regulating operation unit configured to generate a flow rate regulating signal so that the temperature of the first medium flowing out from the primary side outlet becomes equal to a target temperature, a control valve configured to regulate a flow rate of the second medium based on the flow rate regulating signal, and a correcting operation unit configured, based on temperatures detected by the first temperature sensor, the second temperature sensor, the third temperature sensor, and the fourth temperature sensor, (a) to calculate a heat exchange amount of the heat exchanger, a logarithmic mean temperature difference or an average temperature in the heat exchanger, and the flow rate of the second medium, (b) to calculate an overall heat transfer coefficient of the heat exchanger based on the heat exchange amount, the logarithmic mean temperature difference or the average temperature, and the flow rate of the second medium, and (c) to correct a gain of the regulating operation unit based on a change in the heat exchange amount with a change in the flow rate of the second medium supplied to the heat exchanger.

According to a second aspect, the present invention provides an exposure apparatus for exposing a substrate to light, the exposure apparatus comprising a temperature regulating apparatus, and a unit of which temperature is regulated by the first medium, of which temperature is regulated by the temperature regulating apparatus, wherein the temperature regulating apparatus comprises a heat exchanger and regulates a temperature of a first medium by performing heat exchange between the first medium and a second medium via the heat exchanger, a first temperature sensor configured to detect a temperature of the first medium flowing out from a primary side outlet of the heat exchanger, a second temperature sensor configured to detect a temperature of the first medium flowing into a primary side inlet of the heat exchanger, a third temperature sensor configured to detect a temperature of the second medium flowing into a secondary side inlet of the heat exchanger, a fourth temperature sensor configured to detect a temperature of the second medium flowing out from a secondary side outlet of the heat exchanger, a regulating operation unit configured to generate a flow rate regulating signal so that the temperature of the first medium flowing out from the primary side outlet becomes equal to a target temperature, a control valve configured to regulate a flow rate of the second medium based on the flow rate regulating signal, and a correcting operation unit configured, based on temperatures detected by the first temperature sensor, the second temperature sensor, the third temperature sensor, and the fourth temperature sensor, (a) to calculate a heat exchange amount of the heat exchanger, a logarithmic mean temperature difference or an average temperature in the heat exchanger, and the flow rate of the second medium, (b) to calculate an overall heat transfer coefficient of the heat exchanger based on the heat exchange amount, the logarithmic mean temperature difference or the average temperature, and the flow rate of the second medium, and (c) to correct a gain of the regulating operation unit based on a change in the heat exchange amount with a change in the flow rate of the second medium supplied to the heat exchanger.

According to a third aspect, the present invention provides a method of manufacturing a device, the method comprising exposing a substrate to radiant energy using an exposure apparatus for exposing a substrate to light, the exposure apparatus comprising a temperature regulating apparatus, and a unit of which temperature is regulated by the first medium, of which temperature is regulated by the temperature regulating apparatus, developing the exposed substrate, and processing the developed substrate to manufacture the device, wherein the temperature regulating apparatus comprises a heat exchanger and regulates a temperature of a first medium by performing heat exchange between the first medium and a second medium via the heat exchanger, a first temperature sensor configured to detect a temperature of the first medium flowing out from a primary side outlet of the heat exchanger, a second temperature sensor configured to detect a temperature of the first medium flowing into a primary side inlet of the heat exchanger, a third temperature sensor configured to detect a temperature of the second medium flowing into a secondary side inlet of the heat exchanger, a fourth temperature sensor configured to detect a temperature of the second medium flowing out from a secondary side outlet of the heat exchanger, a regulating operation unit configured to generate a flow rate regulating signal so that the temperature of the first medium flowing out from the primary side outlet becomes equal to a target temperature, a control valve configured to regulate a flow rate of the second medium based on the flow rate regulating signal, and a correcting operation unit configured, based on temperatures detected by the first temperature sensor, the second temperature sensor, the third temperature sensor, and the fourth temperature sensor, (a) to calculate a heat exchange amount of the heat exchanger, a logarithmic mean temperature difference or an average temperature in the heat exchanger, and the flow rate of the second medium, (b) to calculate an overall heat transfer coefficient of the heat exchanger based on the heat exchange amount, the logarithmic mean temperature difference or the average temperature, and the flow rate of the second medium, and (c) to correct a gain of the regulating operation unit based on a change in the heat exchange mount with a change in the flow rate of the second medium supplied to the heat exchanger.

According to the present invention, for example, a temperature regulating apparatus that performs stable temperature regulation and its application example are provided.

Further features of the present invention will become apparent from the following description of exemplary embodiments with reference to the attached drawings.

BRIEF DESCRIPTION OF THE DRAWINGS

FIG. 4 is an operation flowchart for a correcting operation unit in the temperature regulating apparatus according to the first embodiment of the present invention;

FIG. 5 is a graph showing cooling capacity with respect to the flow rate of the second medium flowing in the heat exchanger (i.e., the amount of heat exchange between the second medium and the first medium;

FIG. 6 is a block diagram showing an example of the arrangement of a control unit in the first embodiment of the present invention;

DESCRIPTION OF THE EMBODIMENTS

The preferred embodiments of the present invention will be described below with reference to the accompanying drawings.

First Embodiment

Figure 1:
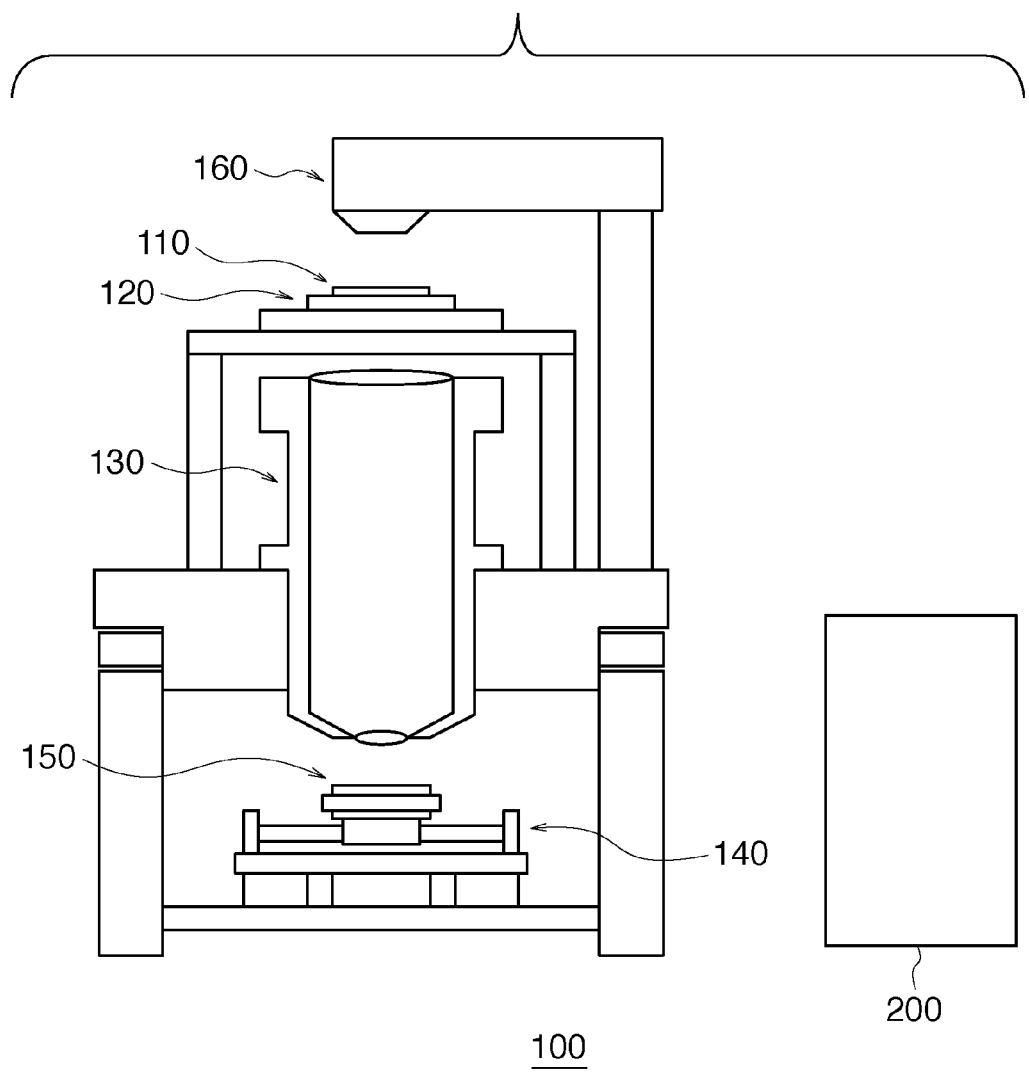
FIG. 1 is a view showing the schematic arrangement of an exposure apparatus according to a preferred embodiment of the present invention.

FIG. 1 is a view showing the schematic arrangement of an exposure apparatus according to a preferred embodiment of the present invention. An illumination optical system 160 illumines a reticle (mask) held by a reticle stage 120 with exposure light provided from a light source (not shown). A projection optical system 130 causes the exposure light transmitted through the reticle 110 to strike a wafer (substrate) 150 placed on a wafer stage 140, thereby forming an image of a pattern of the reticle 110 on the wafer 150. With this operation, the wafer 150 is exposed to light. As a light source, for example, a KrF laser or an ArF laser can be used.

In an exposure apparatus called a stepper, the reticle stage 120 stands still, and the wafer stage 140 stands still during exposure. When the exposure is complete, the wafer stage 140 is step-driven for exposure for the next shot. In an exposure apparatus called a scanning stepper, the reticle stage 120 and the wafer stage 140 are synchronously scanned/driven in opposite directions. A wafer is exposed to light during synchronous scanning. When the exposure is complete, the wafer stage 140 is step-driven for exposure for the next shot.

In the scanning stepper, in order to further improve the productivity, the reticle stage 120 and the wafer stage 140 are accelerated at a higher acceleration, thereby scanning/exposing the wafer to light at a higher velocity. In general, if the reduction ratio of the projection optical system 130 is 4:1, the acceleration ratio and the velocity ratio between the reticle stage 120 and the wafer stage 140 are also 4:1. That is, both the acceleration and velocity of the reticle stage 120 are four times higher than those of the wafer stage 140.

In order to improve the productivity, the acceleration and velocity of each stage are increased more and more. For example, the acceleration of the wafer stage 140 is increased to 1 G to 1.5 G, and its velocity is increased to 300 mm/s to 500 mm/s.

In this manner, the reticle stage 120 and the wafer stage 140 each are driven at a very high velocity to improve the productivity, and the position or velocity of each stage is controlled with extremely high accuracy to decrease the size of a pattern to be formed.

In general, a stage is often scanned/driven or step-driven by a linear motor using a Lorentz force while being levitated by air, a magnetic force, or the like, or by an actuator, such as a planar motor, in some cases. In this case, since the frictional force in the horizontal direction is very small, the thrust force generated by an actuator, which is required for synchronous scanning or step-driving, is proportional to the acceleration and mass of the stage.

For example, the thrust force generated by a linear motor is proportional to a driving current, and the heat generated by the linear motor is equal to the product of the squares of the motor winding resistance and the driving current. Therefore, the heat generated by the linear motor increases in proportion to the square of the thrust force generated, that is, the acceleration of the stage. That is, as the acceleration increases twice, the heat generated by the linear motor increases four times.

In general, in order to accurately control the positions of the reticle stage 120 and wafer stage 140 on the nanometer order, the positions of the reticle stage 120 and wafer stage 140 are always monitored by a laser interferometer and are feedback-controlled. If, however, a large amount of heat is generated as the stages 120 and 140 are driven, the heat disturbs the optical path of the laser interferometer. As a result, the refractive index of air in the optical path fluctuates to cause a large error in position measurement on the stages 120 and 140. To control the stages 120 and 140 on the nanometer order, therefore, the temperature fluctuation of the optical path of the laser interferometer needs to be 0.01° C. or less.

In order to implement ultrafine exposure with high productivity, therefore, it is necessary to use a temperature regulating apparatus (cooling apparatus), which more reliably cools a member that generates a large amount of heat.

Driving mechanisms for the reticle stage 120 and wafer stage 140 generate a large amount of heat during exposure. However, when the wafer 150 or the reticle 110 is replaced, since the stages stop, almost no heat is generated. That is, for the temperature regulating apparatus (cooling apparatus), the width of the load fluctuation is very large, and the fluctuation is rapid.

In addition to the driving mechanisms for the stages 120 and 140, the exposure apparatus 100 includes many precision measurement systems. To expose a wafer to light with an ultrafine pattern, therefore, it is necessary to use a temperature regulating apparatus (cooling apparatus), which cools the precision measurement systems with higher accuracy.

On the other hand, factory cooling water for semiconductor manufacture sometimes fluctuates by several ° C. due to the influence of the operation state of the factory, the air temperature outside the factory, or the like.

In addition, the quality of cooling water supplied to the exposure apparatus sometimes deteriorates with time due to water stain, stains, or the like, in installed pipes.

Demands have, therefore, arisen for an exposure apparatus, including a temperature regulating apparatus, which can always perform stable temperature regulation against the fluctuations of the load, the temperature fluctuations of the cooling water, and temporal changes in the quality of the cooling water and water stain or stains in the installed pipes.

Figure 2:
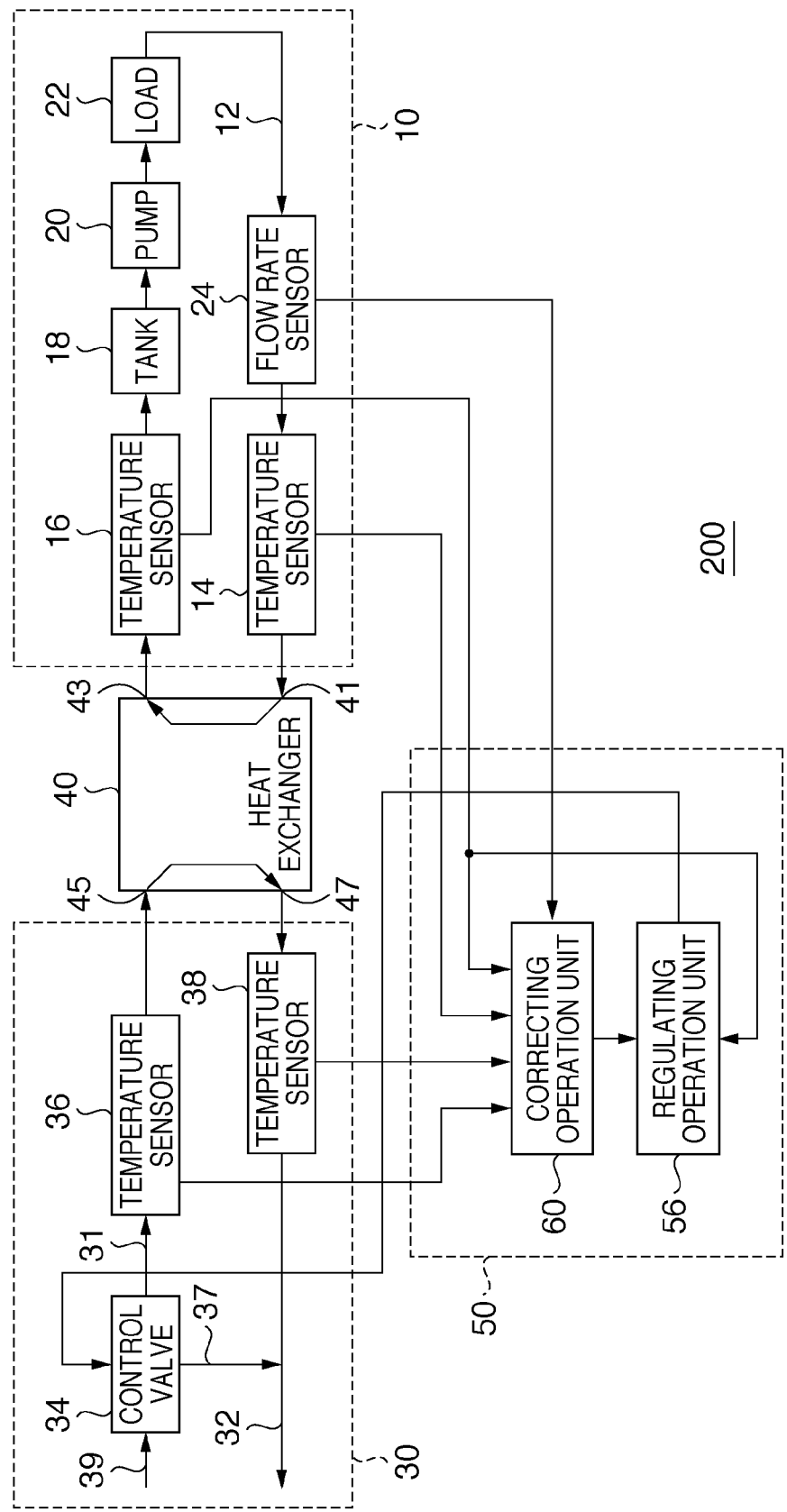
FIG. 2 is a block diagram showing the arrangement of a temperature regulating apparatus in the exposure apparatus according to the first embodiment.

FIG. 2 is a block diagram showing the arrangement of a temperature regulating apparatus in the exposure apparatus according to the first embodiment of the present invention. A temperature regulating apparatus 200 regulates the temperature of a load 22, which is a temperature regulation target in an exposure apparatus 100. The load 22 can be, for example, a heat-generating portion (e.g., a stage mechanism including the driving portion of a stage), a mechanism or structure including a heat-generating portion, a mechanism (e.g., a laser interferometer) that is affected by the heat generated by the heat-generating portion, or a structure or space (e.g., the optical path of the laser interferometer).

The temperature regulating apparatus 200 comprises a heat exchanger 40, a primary side arrangement 10 placed on the primary side of the heat exchanger 40, a secondary side arrangement 30 placed on the secondary side of the heat exchanger 40, and a control unit 50. In this specification, the side on which the load 22, as a temperature regulation target exists when viewed from the heat exchanger 40, will be referred to as the primary side, and the opposite side will be referred to as the secondary side.

The primary side arrangement 10 has a primary side circuit 12 in which a first medium (typically called a refrigerant) flows. The primary side circuit 12 passes through the load 22, which is a portion or space whose temperature is required by the first medium in the exposure apparatus 100. The first medium recovers the heat of the load 22 by passing through the load 22. The second medium (typically called a refrigerant) recovers the heat recovered by the first medium while the first medium passes through the heat exchanger 40. The secondary side arrangement 30 has a secondary side circuit 32 in which the second medium flows.

The primary side circuit 12 is provided with a first temperature sensor 16 which detects the temperature of the first medium flowing out from a primary side outlet 43 of the heat exchanger 40, and a second temperature sensor 14 which detects the temperature of the first medium flowing into a primary side inlet 41 of the heat exchanger 40. The primary side circuit 12 is provided with a pump 20 for circulating the first medium. The pump 20 or pumps 20 may be provided either or both between the primary side outlet 43 of the heat exchanger 40 and the load 22 or between the primary side inlet 41 of the heat exchanger 40 and the load 22. In addition, the primary side circuit 12 can be provided with a tank 18. The tank 18 or tanks 18 may be provided either or both between the primary side outlet 43 of the heat exchanger 40 and the load 22 and between the primary side inlet 41 of the heat exchanger 40 and the load 22.

The primary side circuit 12 can be provided with a flow rate sensor 24 which detects the flow rate of the first medium. Since the pressure loss in the primary side circuit 12 and the capacity (the number of revolutions) of the pump 20 are generally adjusted to set the flow rate of the first medium to a target flow rate, the flow rate sensor 24 may not be required. When the flow rate sensor 24 is provided on the primary side circuit 12, the position at which the flow rate sensor 24 is provided is not specifically limited.

The first medium can be a liquid or a gas, as long as it is a fluid. As a liquid, a substance generally used as a refrigerant, for example, pure water or brine, can be used. Note that when a gas is to be used, a fan can be used as the pump 20.

The second medium flowing in the secondary side circuit 32 is typically factory cooling water 39 supplied from the factory. In general, water or pure water is often used as the second medium. A control valve 34 causes factory cooling water to branch off to a main circuit 31 and a branch circuit 37. The branch circuit 37 is a circuit that bypasses the heat exchanger 40. The main circuit 31 of the secondary side circuit 32 is provided with a third temperature sensor 36 that detects the temperature of the second medium flowing into a secondary side inlet 45 of the heat exchanger 40, and a fourth temperature sensor 38 that detects the temperature of the second medium flowing out from a secondary side outlet 47 of the heat exchanger 40.

As the temperature sensors 14, 16, 36, and 38, for example, temperature sensors, such as a thermocouple or platinum resistor, can be used. Temperature sensors corresponding to required temperature accuracies are used. As the control valve 34, a valve that allows proportional control is preferably used. Alternatively, two proportional two-way valves may be placed in the main circuit 31 and branch circuit 37 and be operated by push-pull driving.

As the flow rate sensor 24, for example, a Karman vortex sensor, an electromagnetic sensor, or a gear-type sensor, can be suitably used. Note that if the first medium is a gas, a massflow sensor, or the like, is used as the flow rate sensor 24.

As the heat exchanger 40, for example, a shell and tube heat exchanger or a brazing heat exchanger can be used. Note that if the first medium is a gas, a cooling oil, or the like, can be used. In the first embodiment, the input and output of the first medium are connected to the input and output of the second medium in correspondence with each other. In general, as a heat exchanger, a counter flow heat exchanger is often used because heat exchange by counter flows exhibits the highest efficiency. However, a parallel flow heat exchanger may be employed in which the input and output of the first medium are parallel to the input and output of the second medium.

The control unit 50 comprises a regulating operation unit 56 and a correcting operation unit 60. Output signals from the temperature sensors 14, 16, 36, and 38 and the flow rate sensor 24 are provided to the correcting operation unit 60. Note that if the flow rate of the first medium is adjusted to a target flow rate, and the flow rate sensor 24 is not mounted, the flow rate information can be held in the correcting operation unit 60.

Figure 3:
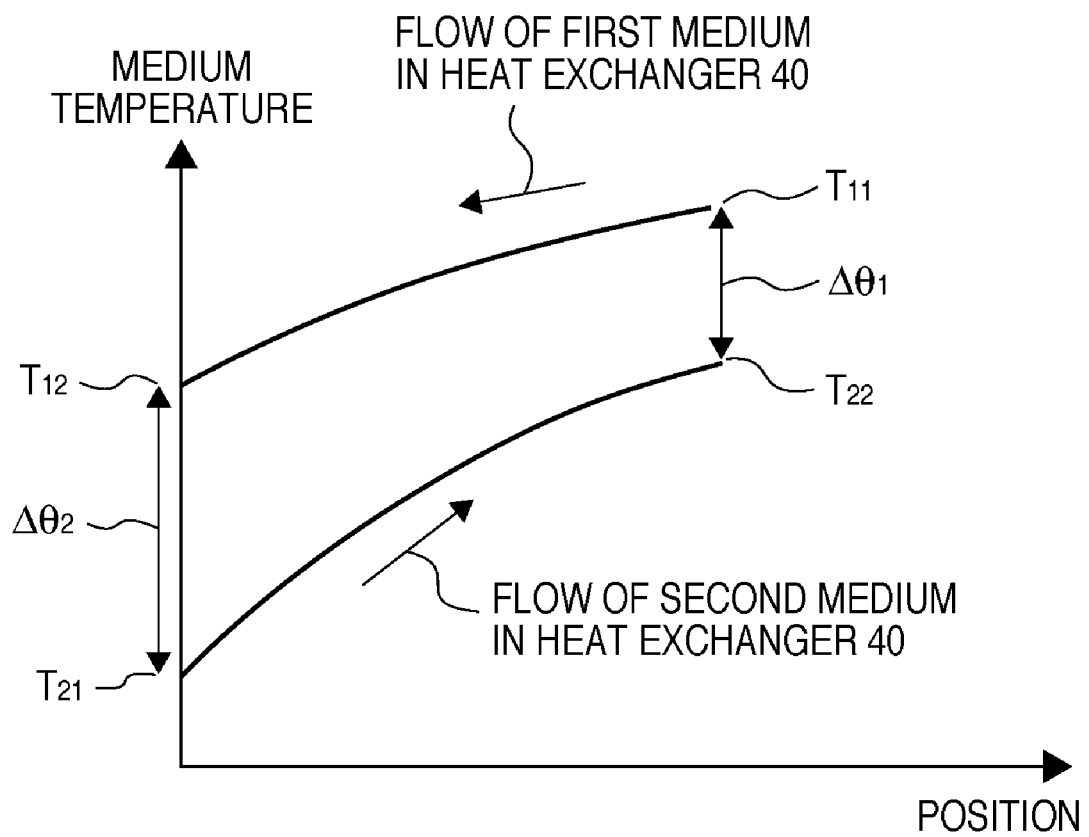
FIG. 3 is a graph showing the temperature characteristic of a heat exchanger in the temperature regulating apparatus according to the first embodiment of the present invention.

FIG. 3 is a graph showing the temperature characteristic of the heat exchanger 40 in the temperature regulating apparatus 200 according to the first embodiment of the present invention. FIG. 4 is an operation flowchart for the correcting operation unit 60 in the temperature regulating apparatus 200 according to the first embodiment of the present invention.

FIG. 3 shows the temperature characteristic of the heat exchanger 40 in the arrangement in which the first and second media flowing in the heat exchanger 40 form counter flows. Let $T_{11}$ be the temperature of the first medium at the primary side inlet 41 of the heat exchanger 40. The abscissa represents the position in the heat exchanger 40. When the second medium recovers heat at the primary side outlet 43, the first medium has a temperature $T_{12}$. At the secondary side inlet 45, the second medium has a temperature $T_{21}$. Upon recovering the heat of the first medium at the secondary side outlet 47, the second medium has a temperature $T_{22}$.

An operation procedure in the correcting operation unit 60 will be described with reference to FIG. 4. This operation flowchart is about a counter flow heat exchanger.

In Step 1, the correcting operation unit 60 calculates a heat quantity Q1, which the second medium has recovered from the first medium in the heat exchanger 40, based on outputs from the first temperature sensor 16, the second temperature sensor 14, and the flow rate sensor 24 (or flow rate information held in advance) according to equations (1) and (2).

The correcting operation unit 60 also calculates a flow rate F2 of the second medium flowing in the heat exchanger 40 based on outputs from the third temperature sensor 36 and fourth temperature sensor 38 according to equation (3), $$Q1=F1*(T_{11}-T_{12})*G1 \qquad (1)$$

$$G1=\rho1*\phi1 \qquad (2)$$

$$F2=Q1/\{(T_{22}-T_{21})*G2\} \qquad (3)$$

where
Q1, Q2: heat quantity [W]
F1, F2: flow rate [m³/s]
ρ1, ρ2: density [kg/m³]
cp1, cp2: specific heat [kJ/kg° C.]
The suffixes 1 and 2 represent the first and second media, respectively, and W=[J/s].

In step 2, the correction operation unit 60 calculates a logarithmic mean temperature difference ΔTm or an average temperature Tave on the basis of outputs from the temperature sensors 14, 16, 36, and 38. In this case, the logarithmic mean temperature difference ΔTm is calculated according to equations (4) to (6), and the average temperature Tave is calculated according to equation (7).

$$\Delta\theta2=T_{12}-T_{21} \qquad (4)$$

$$\Delta\theta1=T_{11}-T_{22} \qquad (5)$$

$$\Delta Tm=(\Delta\theta1-\Delta\theta2)/\ln(\Delta\theta1/\Delta\theta2) \qquad (6)$$

$$Tave=(\Delta\theta1+\Delta\theta2)/2 \qquad (7)$$

The following exemplifies a case in which, of a logarithmic mean temperature difference and an average temperature, the logarithmic mean temperature difference is calculated in step 2 and used for the subsequent calculations. However, an average temperature can be used instead of a logarithmic mean temperature difference. In this case, the logarithmic mean temperature difference ΔTm may be replaced with the average temperature Tave in the following description.

In step 3, the correcting operation unit 60 calculates an overall heat transfer coefficient K of the heat exchanger 40, according to equation (8), based on the value Q1 and ΔTm calculated in steps 1 and 2, $$K=Q1/A/\Delta Tm \qquad (8)$$

where
K: overall heat transfer coefficient [W/m²° C.]
A: heat transfer area [m²].

The overall heat transfer coefficient K varies depending on the flow rate and stain, or the like, in the heat exchanger 40. The heat transfer area A of the heat exchanger 40 is a fixed value determined by the structure of the heat exchanger 40.

In step 4, the correcting operation unit 60 calculates the temperature $T_{22}$ of the second medium flowing out from the secondary side outlet 47 of the heat exchanger 40, according to equations (9) to (12), on the basis of the flow rate F2 calculated in step 1. Note that since the temperature $T_{22}$ is measured by the temperature sensor 38, it suffices to omit the operation in step 4 and the use of the measurement value of the temperature $T_{22}$.

$$R=(F2*G2)/(F1*G1) \qquad (9)$$

$$\phi=K*A/(F2*G2) \qquad (10)$$

$$\epsilon=[1-\exp\{-(1-R)*\phi\}]/[1-R*\exp\{-(1-R)*\phi\}] \qquad (11)$$

$$T_{22}=\epsilon*(T_{11}-T_{21})+T_{21} \qquad (12)$$

In step 5, the correcting operation unit 60 calculates a temperature $T'_{22}$ of the second medium flowing out from the secondary side outlet 47 of the heat exchanger 40 when the flow rate differs from the flow rate F2 of the second medium calculated in step 1 by $\Delta F2$, according to equations (13) to (17).

$$F2 = F2 + \Delta F2 \tag{13}$$

$$R' = (F2*G2)/(F1*G1) \tag{14}$$

$$\phi' = K*A/(F2*G2) \tag{15}$$

$$\epsilon' = [1-\exp\{-(1-R')*\phi'\}]/[1-R'*\exp\{-(1-R')*\phi'\}] \tag{17}$$

$$T'_{22} = \epsilon'*(T_{11}-T_{21}) + T_{21}$$

In step 6, the correcting operation unit 60 calculates a heat exchange amount Q'2 of the heat exchanger 40 when the flow rate differs from the flow rate F2 of the second medium by $\Delta F2$, according to equation (18).

$$Q'2 = F2*(T_{21}-T'_{22})*G2 \tag{18}$$

In step 7, the correcting operation unit 60 calculates a change in the heat exchange amount of the heat exchanger 40 with a flow rate change $\Delta F2$ of the second medium, that is, a change $\Delta G$ in the gain of the temperature regulating apparatus 200, according to equation (19).

$$\Delta G = (Q2-Q'2)/\Delta F2 \tag{19}$$

The gain of the temperature regulating apparatus 200 will be described with reference to FIG. 5. FIG. 5 is a graph showing cooling capacity for the flow rate of the second medium flowing in the heat exchanger 40, that is, the heat exchange amount between the second media and the first media, with temperatures Ta, Tb, and Tc (Ta<Tb<Tc) of the second medium as parameters. The gain of the temperature regulating apparatus 200 is represented by the gradient of the graph (=$\Delta$ heat exchange amount/$\Delta$ flow rate). The gain of the temperature regulating apparatus 200 changes depending on the temperature and flow rate of the second medium. As the temperature decreases and the flow rate decreases, the gain increases.

In addition, the heat exchange efficiency changes depending on a fluctuation of the load 22 whose temperature is regulated by the first medium, the quality of the second medium, water stain, or stains in the installed pipes, and the like. Along with this change, the gain of the temperature regulating apparatus 200 changes.

It is, therefore, possible to accurately detect the gain of the temperature regulating apparatus 200, which changes depending on a fluctuation of the load 22 whose temperature is regulated by the first medium and the temperature and the flow rate of the second medium, based on the gain change AG calculated in step 7. In addition, it is possible to accurately detect the gain of the temperature regulating apparatus 200, which changes with time depending on the quality of the second medium, water stain, or stains in the installed pipes, and the like, based on the gain change $\Delta G$ calculated in step 7.

FIG. 6 is a block diagram showing an example of the arrangement of the control unit 50. A target temperature 52 and the temperature of the first medium (an output from the first temperature sensor 16) flowing out from the primary side outlet 43 of the heat exchanger 40 are provided to a computing unit (subtracter) 54. The computing unit 54 computes the difference (deviation signal) between the target temperature 52 and the temperature (feedback signal) of the first medium flowing out from the primary side outlet 43 of the heat exchanger 40, and provides the difference to a compensator 90 (more specifically, a gain correcting unit 78 of the compensator 90). The compensator 90 amplifies the difference with the gain of the compensator 90 and generates a flow-rate regulating signal.

A signal representing the gain change $\Delta G$ generated by the correcting operation unit 60 is provided to the computer 90 (more specifically, the gain correcting unit 78 of the compensator 90), preferably, via a lag computer 80. The gain of the gain correcting unit is changed in accordance with this signal. The lag compensator 80 performs a lag compensation by using, for example, a dead time, or a first-order lag system, or a higher-order lag system, or a dead time and a first-order lag system, or a dead time and a higher-order lag system in consideration of the lag characteristic of the heat exchanger 40 or control valve 34. If the response lag of the heat exchanger 40 or control valve 34 is negligible, lag compensation need not be performed (that is, the lag compensator 80 need not be provided).

In addition to the gain correcting unit 78, the compensator 90 can comprise a proportional element (P) 70, an integral element (I) 72, a derivative element (D) 74, and an adder 76.

The gain correcting unit 78 corrects the gain of the regulating operation unit 56 (more specifically, the compensator 90) based on the change AG in the gain of the temperature regulating apparatus 200. The gain correcting unit 78 preferably corrects the gain of the regulating operation unit 56 by, for example, multiplying a deviation signal by the reciprocal (1/$\Delta G$) of the change $\Delta G$ in the gain of the temperature regulating apparatus 200. With this operation, a fluctuation in the gain of the regulation operation unit 56 (the compensator 90, to be described later) is suppressed. An output from the gain correcting unit 78 is provided to the proportional element (P) 70, the integral element (I) 72, and the derivative element (D) 74. The adder 76 generates a flow regulating signal (a manipulated variable for the control valve 34) for controlling the control valve 34 by adding outputs from the proportional element (P) 70, integral element (I) 72, and derivative element (D) 74. The method of controlling the control valve 34 by using the flow rate regulating signal obtained by adding outputs from the proportional element (P) 70, integral element (I) 72, and derivative element (D) 74 is called PID control. The compensator 90 for PID control can be called a PID compensator.

The control valve 34 regulates the flow rate of the second medium flowing into the main circuit 31 in accordance with the provided flow rate regulating signal (manipulated variable) so as to equalize the temperature of the first medium flowing out from the primary side outlet 43 of the heat exchanger 40 to the target temperature 52.

According to the first embodiment, it is possible to accurately calculate the gain of the heat exchanger, which changes depending on a fluctuation of the load controlled by the first medium, and the gain of the temperature regulating apparatus, which changes with time depending on the quality of the second medium, water stain, or stains in the installed pipes, and the like. Controlling the gain of the regulating operation unit can correct a change in the gain. This makes is possible to always perform stable temperature regulation on the load 22.

Second Embodiment

Figure 7:
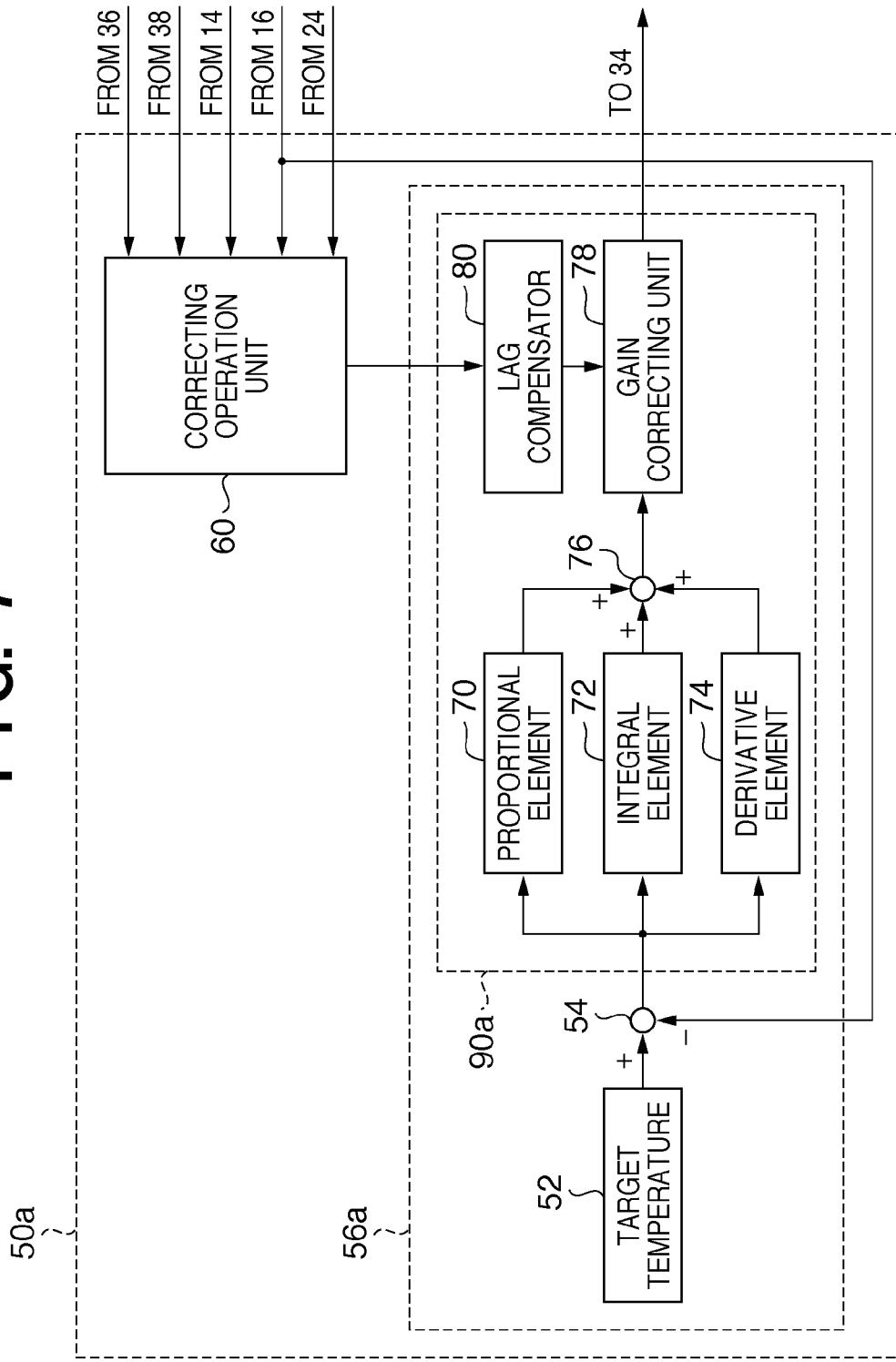
FIG. 7 is a block diagram showing an example of the arrangement of a control unit in the second embodiment of the present invention.

The second embodiment differs from the first embodiment in a control unit 50, more specifically, the arrangement in a regulating operation unit 56 of the control unit 50. More specifically, the second embodiment has an arrangement in which the control unit 50 shown in FIG. 6 is replaced with a control unit 50a shown in FIG. 7. The control unit 50a differs from the control unit 50 in that the regulating operation unit 56 (compensator 90) is replaced with a regulating operation unit 56a (compensator 90a). Note that things to which no reference is made can conform to the first embodiment.

In the second embodiment, the lag compensator 80 and the gain correcting unit 78 are arranged behind the adder 76. Operation in the lag compensator 80 and operation in the gain correcting unit 78 can be the same as those in the regulating operation unit 56.

According to the second embodiment, it is possible to accurately calculate the gain of the heat exchanger, which changes depending on a fluctuation in the load controlled by the first medium and the temperature and flow rate of the second medium, and the gain of the temperature regulating apparatus, which changes with time depending on the quality of the second medium, water stain, or stains in the installed pipes, or the like. Controlling the gain of the regulating operation unit can correct a change in the gain. This makes it possible to always perform stable temperature regulation on the load 22.

Third Embodiment

Figure 8:
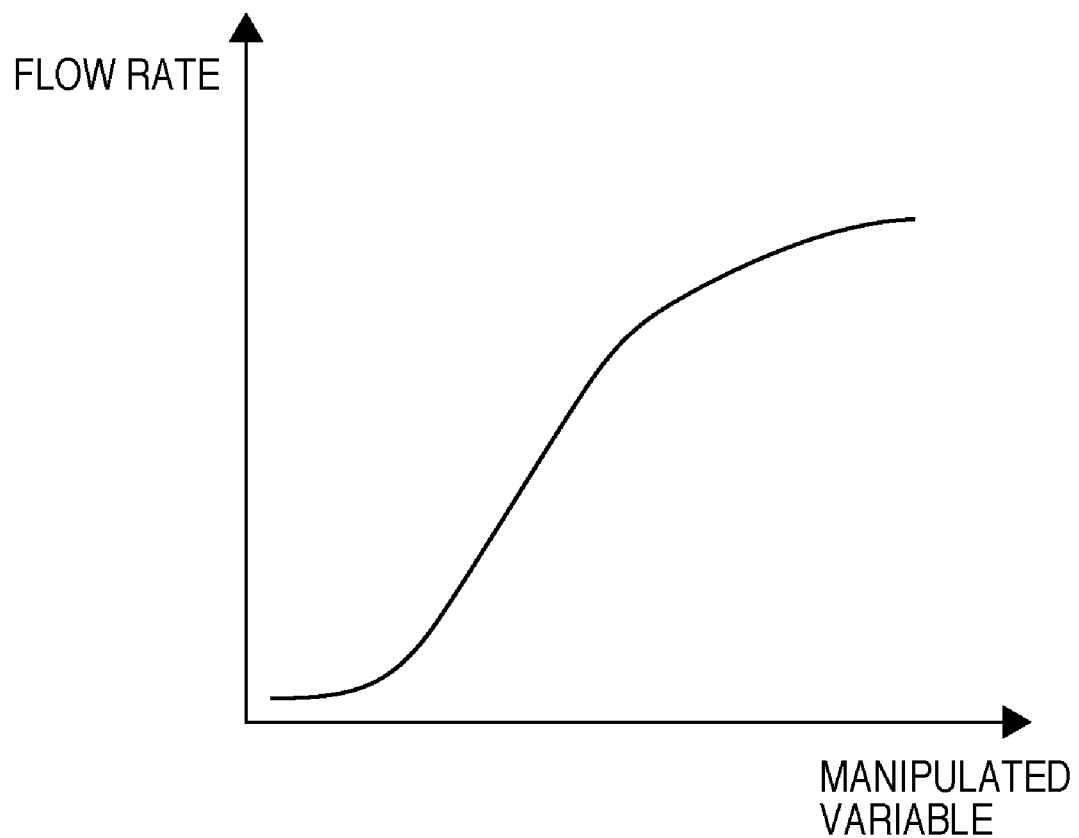
FIG. 8 is a graph showing an example of the flow rate characteristic of a control valve in the third embodiment of the present invention.

FIG. 8 is a graph showing the input/output characteristic of a control valve 34, that is, the relationship between the manipulated variable of the control valve 34 and the flow rate. In general, the input/output characteristic of the control valve 34 is often not linear, but nonlinear. Due to the nonlinear characteristic of the control valve 34, the gain represented by ($\Delta$ flow rate)/($\Delta$ manipulated variable) changes. If, therefore, temperature regulation is performed without correction of the gain fluctuation of the control valve, the temperature stability will deteriorate.

Figure 9:
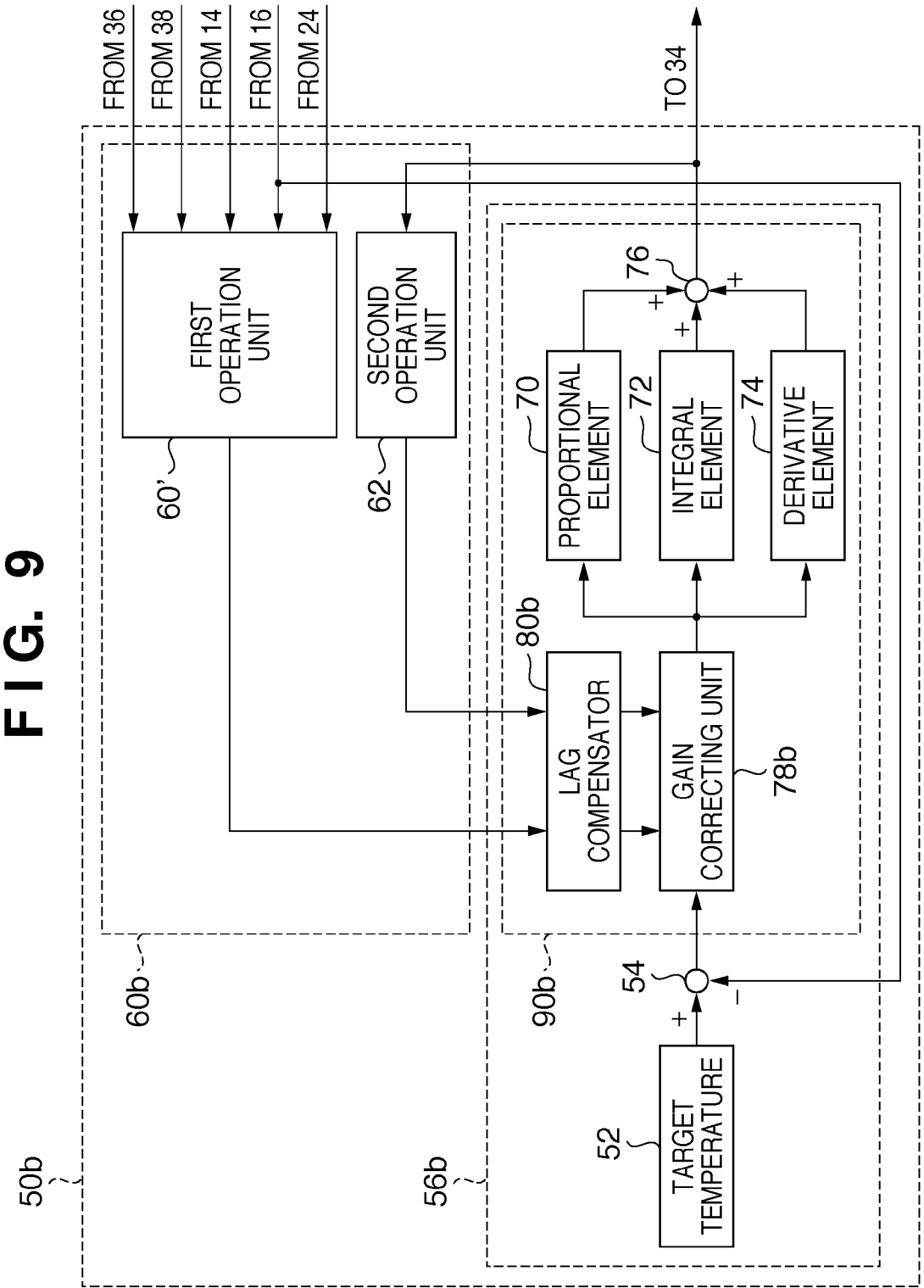
FIG. 9 is a block diagram showing an example of the arrangement of a control unit in the third embodiment of the present invention.

The third embodiment differs from the first embodiment in the arrangement of the control unit. More specifically, the third embodiment has an arrangement in which the control unit 50 shown in FIG. 6 is replaced with a control unit 50b shown in FIG. 9. In this case, the control unit 50 differs from the control unit 50b in that the regulating operation unit 56 and the correcting operation unit 60 are replaced with a regulating operation unit 56b and a correcting operation unit 60b, respectively. Note that elements to which no reference is made can conform to the first embodiment.

The correcting operation unit 60b includes a first operation unit 60' and a second operation unit 62. The first operation unit 60' can have the same arrangement as that of the correcting operation unit 60 in the first embodiment.

The second operation unit 62 holds information indicating the input/output characteristics (gain change) of the control valve 34. The second operation unit 62 calculates a change in $\Delta G2$ in the gain of the control valve 34 based on this information and a flow rate regulating signal (a manipulated variable for the control valve 34) output from an adder 76, and provides the change to a gain correcting unit 78, preferably, via a lag compensator 80b. The lag compensator 80b performs lag compensation in consideration of the lag characteristic of a heat exchanger 40 or the control valve 34 based on a gain change $\Delta G$ provided from the first operation unit 60' (corresponding to the correcting operation unit 60 in the first embodiment) and the change $\Delta G2$ in the gain of the control valve 34 which is provided from the second operation unit 62. It is possible to perform a lag compensation by using, for example, a dead time, or a first-order lag system, or a high-order lag system, or a dead time and a first-order lag system, or a dead time and a higher-order lag system. If the response lag of the heat exchanger 40 or control valve 34 is negligible, lag compensation need not be performed (that is, a lag compensator 80 need not be provided).

A gain correcting unit 78b corrects the gain of the regulating operation unit 56 based on the change $\Delta B$ in the gain of a temperature regulating apparatus 200 and the change $\Delta G2$ in the gain of the control valve 34. The gain correcting unit 78b preferably corrects the gain of the regulating operation unit 56 by, for example, multiplying a deviation signal by the reciprocal ($1/\Delta G$) of the change $\Delta G$ in the gain of the temperature regulating apparatus 200 and the reciprocal ($1/\Delta G2$) of the change $\Delta G2$ in the gain of the control valve 34.

According to the third embodiment, in addition to the effects of the first embodiment, it is possible to perform stable temperature regulation on the load 22 by calculating the gain of the control valve that regulates the flow rate of the second medium and corrects a change in the gain of the control valve.

Fourth Embodiment

Figure 10:
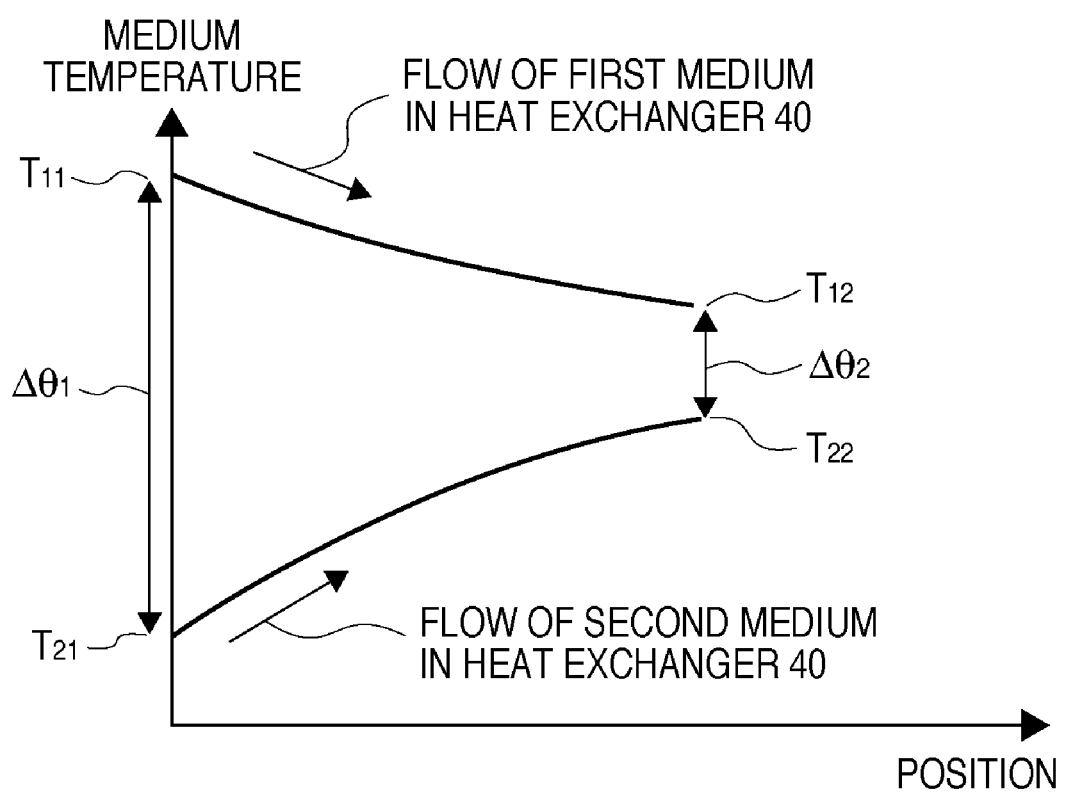
FIG. 10 is a graph showing the temperature characteristic of a heat exchanger in a temperature regulating apparatus according to the fourth embodiment of the present invention.
Figure 11:
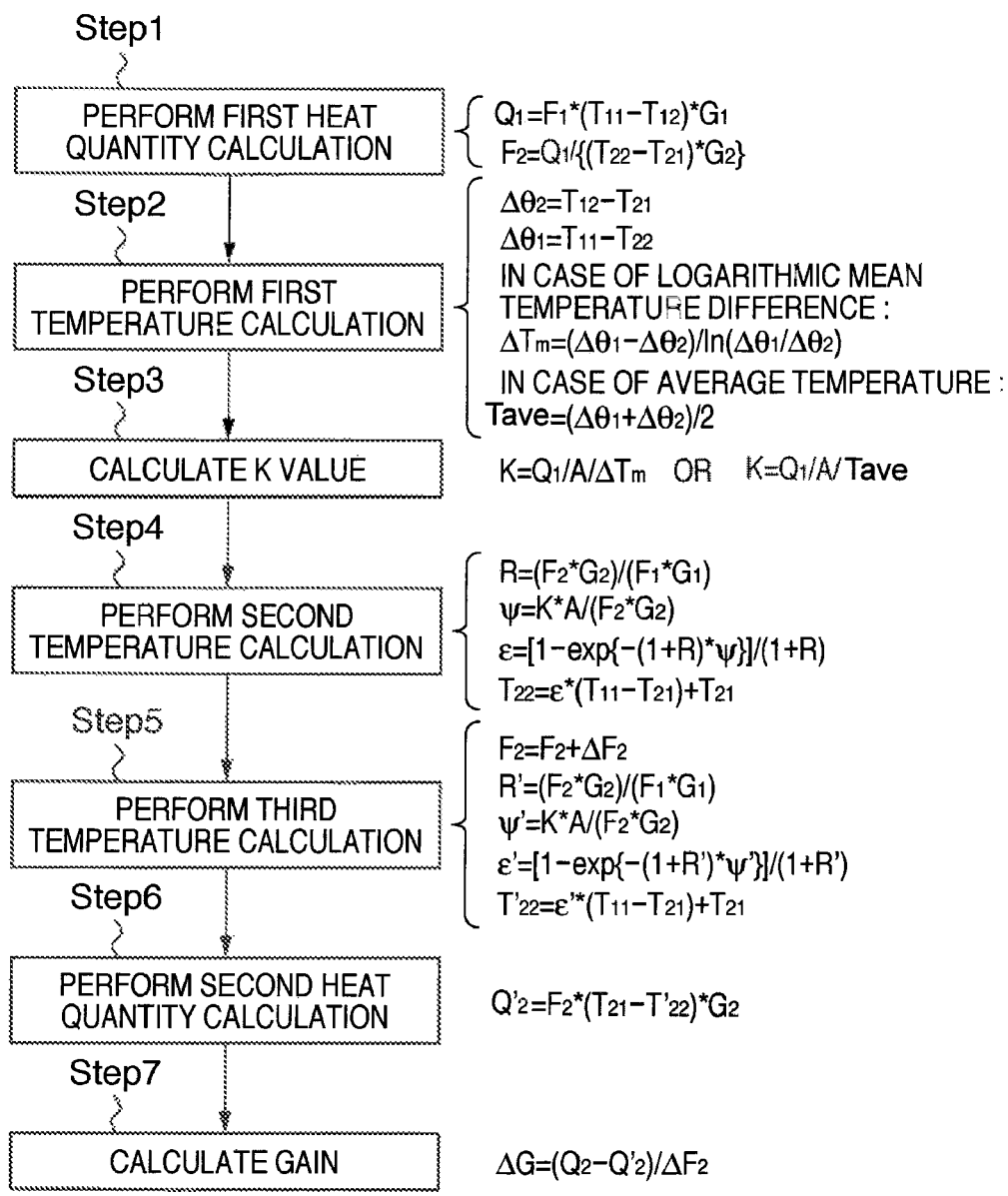
FIG. 11 is an operation flowchart for a correcting operation unit in the temperature regulating apparatus according to the fourth embodiment of the present invention.

FIG. 10 is a graph showing the temperature characteristic of a heat exchanger in a temperature regulating apparatus 200 according to the fourth embodiment of the present invention. FIG. 11 is an operation flowchart for a correcting operation unit 60 in the temperature regulating apparatus 200 according to the fourth embodiment of the present invention.

FIG. 10 shows the temperature characteristic of the heat exchanger 40 in an arrangement in which the first and second media flowing in a heat exchanger 40 form parallel flows. Let $T_{11}$ be the temperature of the first medium at a primary side inlet 41 of the heat exchanger 40. The abscissa represents the position in the heat exchanger 40 through which the first medium passes. When the second medium recovers heat at a primary side outlet 43, the first medium has a temperature $T_{12}$. At a secondary side inlet 45, the second medium has a temperature $T_{21}$. Upon recovering the heat of the first medium at a secondary side outlet 47, the second medium has a temperature $T_{22}$. In general, the parallel flow scheme is inferior in heat exchange efficiency to the counter flow scheme shown in FIG. 3.

An operation procedure in the correcting operation unit 60 will be described next with reference to the flowchart of FIG. 11. This operation flowchart is about a parallel flow heat exchanger.

In step 1, the correcting operation unit 60 calculates a heat quantity Q1 recovered from the first medium in the heat exchanger 40 based on signals from a first temperature sensor 16, a second temperature sensor 14, and a flow rate sensor 24 according to equations (21) and (22).

In addition, a flow rate F2 of the second medium flowing in the heat exchanger 40 is calculated from signals from temperature sensors 36 and 38.

$$Q1 = F1^{*}(T_{11}-T_{12})^{*}G1 \tag{20}$$

$$G1 = \rho1^{*}cp1 \tag{21}$$

$$F2 = Q1/\{(T_{22}-T_{21})^{*}G2\} \tag{22}$$

where

Q1, Q2: heat quantity [W]
F1, F2: flow rate [m³/s]
$\rho1, \rho2$: density [kg/m³]
cp1, cp2: specific heat [kJ/kg ° C.]

The suffixes 1 and 2 represent the first and second media, respectively, and W=[J/s].

In step 2, the correcting operation unit 60 calculates a logarithmic mean temperature difference $\Delta Tm$ or an average temperature Tave based on outputs from the temperature sensors 14, 16, 36, and 38. In this case, the logarithmic mean temperature difference ΔTm is calculated according to equations (23) to (25), and the average temperature Tave is calculated according to equation (26).

$$\Delta\theta = T_{12} - T_{22} \tag{23}$$

$$\Delta\theta = T_{11} - T_{21} \tag{24}$$

$$\Delta Tm = (\Delta\theta 1 - \Delta\theta 2)/\ln(\Delta\theta 1/\Delta\theta 2) \tag{25}$$

$$Tave = (\Delta\theta 1 + \Delta\theta 2)/2 \tag{26}$$

The following exemplifies a case in which, of a logarithmic mean temperature difference and an average temperature, the logarithmic mean temperature difference is calculated in step 2 and used for the subsequent calculations. However, an average temperature can be used instead of a logarithmic mean temperature difference. In this case, the logarithmic mean temperature difference ΔTm may be replaced with the average temperature Tave in the following description.

In step 3, the correcting operation unit 60 calculates the overall heat transfer coefficient of the heat exchanger 40, according to equation (27), based on the values Q1 and ΔTm calculated in steps 1 and 2.

$$K = Q1/A/\Delta Tm \tag{27}$$

where
K: overall heat transfer coefficient [W/m$^2$° C.]
A: heating transfer area [m$^2$]

The overall heat transfer coefficient K varies depending on the flow rate and stain, or the like, in the heat exchanger 40. The heating transfer area A of the heat exchanger 40 is the fixed value determined by the structure of the heat exchanger 40.

In step 4, the correcting operation unit 60 calculates the temperature $T_{22}$ of the second medium flowing out from the secondary side outlet 47 of the heat exchanger 40, according to equations (28) to (31), on the basis of the flow rate F2 calculated in step 1. Note that since the temperature $T_{22}$ is measured by the temperature sensor 38, it suffices to omit the operation in step 4 and use the measured value of the temperature $T_{22}$.

$$R = (F2*G2)/(F1*G1) \tag{28}$$

$$\phi = K*A/(F2*G2) \tag{29}$$

$$\epsilon = [1 - \exp\{-(1-R)*\phi\}]/(1+R) \tag{30}$$

$$T_{22} = \epsilon(T_{11} - T_{21}) + T_{21} \tag{31}$$

In step 5, the correcting operation unit 60 calculates a temperature $T'_{22}$ of the second medium flowing out from the secondary side outlet 47 of the heat exchanger 40 when the flow rate differs from the flow rate F2 of the second medium calculated in step 1 by ΔF2, according to equations (32) to (36).

$$F2 = F2 + \Delta F2 \tag{32}$$

$$R' = (F2*G2)/(F1*G1) \tag{33}$$

$$\phi' = K*A/(F2*G2) \tag{34}$$

$$\epsilon' = [1 - \exp\{-(1-R')*\phi'\}]/(1+R) \tag{35}$$

$$T'_{22} = \epsilon'*(T_{11} - T_{21}) + T_{21} \tag{36}$$

In step 6, the correcting operation unit 60 calculates a heat exchange amount Q'2 of the heat exchanger 40 when the flow rate differs from the flow rate F2 of the second medium by ΔF2, according to equation (37).

$$Q'2 = F2*(T_{21} - T'_{22})*G2 \tag{37}$$

In step 7, the correcting operation unit 60 calculates a change in the heat exchange amount of the heat exchanger 40 with a flow rate change ΔF2 of the second medium, and calculates a gain ΔG of the heat exchanger.

$$\Delta G = (Q2 - Q'2)/\Delta F2 \tag{38}$$

It is, therefore, possible to accurately detect the gain of the temperature regulating apparatus 200, which changes depending on a fluctuation of a load 22 whose temperature is regulated by the first medium and the temperature and flow rate of the second medium, based on the gain change ΔG calculated in step 7. In addition, it is possible to accurately detect the gain of the temperature regulating apparatus 200, which changes with time depending on the quality of the second medium, water stain, or stains in the installed pipes, and the like, based on the gain change ΔG calculated in step 7. The arrangement of the regulating operation unit can conform to the first, second, and third embodiments.

According to the fourth embodiment, it is possible to accurately calculate the gain of the heat exchanger, which changes depending on a fluctuation of the load controlled by the first medium and the temperature and flow rate of the second medium, and the gain of the temperature regulating apparatus, which changes with time depending on the quality of the second medium, water stain, or stains in the installed pipes, and the like. Controlling the gain of the regulating operation unit can correct a change in the gain. This makes it possible to always perform stable temperature regulation on the load 22.

Fifth Embodiment

In the fifth embodiment, a correcting operation unit 60 holds the allowable value of an overall heat transfer coefficient K of a heat exchanger which is calculated in accordance with the operation flowchart in FIG. 4 or the operation flowchart in FIG. 11. The correcting operation unit 60 compares the K value with the allowable value. If the K value deviates from the allowable value, the correcting operation unit 60 notifies a warning unit (not shown) provided for a temperature regulating apparatus 200 of the corresponding information. Based on the notification, the warning unit generates a warning. The warning unit warns against a decrease in the gain of the temperature regulating apparatus that changes with time depending on the quality of the second medium, water stain, or stains in the installed pipes, and the like. This makes it possible to return the overall heat transfer coefficient K of the heat exchanger to a predetermined value by, for example, cleaning the interior of the heat exchanger or replacing the heat exchanger, thereby implementing stable temperature regulation. The above allowable lower limit value can be a value that makes it difficult to perform stable temperature regulation by gain correction in the first to fourth embodiments, or a value in a range in which gain correction is permitted. Alternatively, it suffices to warn against a decrease in the gain of the heat exchanger, even if the urgency is low, depending on the quality of the second medium, water stain, or stains in the installed pipes, and the like, and to re-check the water quality and stains in the pipes at the time of facility inspection.

(Supplementary Explanation)

In this specification and claims, each portion using the expression "B is calculated based on A, and C is calculated based on B" includes an operation that C is calculated according to f1 (f2(A)). In this case, f2 is the function of A, and f1 is the function of f2 and includes items including B.

(Application)

A device manufacturing method according to the preferred embodiments of the present invention is suitable for the manufacture of devices (e.g., a semiconductor device and a liquid crystal device). This method can include a step of exposing a substrate coated with a photoresist to light by using the exposure apparatus discussed above, and a step of developing the substrate exposed in the exposing step. In addition to the above steps, the device manufacturing method can include other known steps (e.g., oxidation, film forming, evaporation, doping, planarization, etching, resist removing, dicing, bonding, and packaging steps).

While the present invention has been described with reference to exemplary embodiments, it is to be understood that the invention is not limited to the disclosed exemplary embodiments. The scope of the following claims is to be accorded the broadest interpretation so as to encompass all such modifications and equivalents structures and functions.

What is claimed is:

1. A temperature regulating apparatus that includes a heat exchanger and regulates a temperature of a first medium by performing heat exchange between the first medium and a second medium via the heat exchanger, the apparatus comprising:
   a first temperature sensor configured to detect a temperature of the first medium flowing out from a primary side outlet of the heat exchanger;
   a second temperature sensor configured to detect a temperature of the first medium flowing into a primary side inlet of the heat exchanger;
   a third temperature sensor configured to detect a temperature of the second medium flowing into a secondary side inlet of the heat exchanger;
   a fourth temperature sensor configured to detect a temperature of the second medium flowing out from a secondary side outlet of the heat exchanger;
   a regulating operation unit configured to generate a flow rate regulating signal so that the temperature of the first medium flowing out from the primary side outlet becomes equal to a target temperature;
   a control valve configured to regulate a flow rate of the second medium based on the flow rate regulating signal; and
   a correcting operation unit configured (a) to calculate, based on temperatures detected by the first temperature sensor, the second temperature sensor, the third temperature sensor, and the fourth temperature sensor, a heat exchange amount of the heat exchanger, a logarithmic mean temperature difference or an average temperature in the heat exchanger, and the flow rate of the second medium, (b) to calculate an overall heat transfer coefficient of the heat exchanger based on the calculated heat exchange amount and either the calculated logarithmic mean temperature difference or the calculated average temperature, z-rate (c) to obtain a ratio ($\Delta G$) of a change (Q2-Q'2) in the heat exchange amount to a change ($\Delta F2$) in the flow rate of the second medium based on the calculated flow rate (F2) of the second medium and the calculated overall heat transfer coefficient (K), and (d) to output the obtained ratio to the regulating operation unit to correct a gain of the regulating operation unit.

2. An apparatus according to claim 1, wherein the regulating operation unit includes a compensator configured to generate the flow rate regulating signal by amplifying a difference between the target temperature and the temperature of the first medium at the primary side outlet, and the correcting operation unit is configured to correct a gain of the compensator.

3. An apparatus according to claim 2, wherein the correcting operation unit is configured to correct the gain so as to suppress a fluctuation in the gain.

4. An apparatus according to claim 2, wherein the compensator includes a PID compensator.

5. An apparatus according to claim 2, wherein the compensator includes a gain correcting unit, and the correcting operation unit is configured to change a gain of the gain correcting unit.

6. An apparatus according to claim 5, wherein the compensator further includes a lag compensator, and a signal from the correcting operation unit is supplied to the gain correcting unit via the lag compensator.

7. An apparatus according to claim 1, further comprising a warning unit configured to generate a warning if the overall heat transfer coefficient calculated by the correcting operation unit deviates from an allowable value.

8. An exposure apparatus for exposing a substrate to light, the exposure, apparatus comprising:
   (a) a temperature regulating apparatus; and
   (b) a unit of which temperature is regulated via a first medium, of which temperature is regulated by the temperature regulating apparatus,
   wherein the temperature regulating apparatus comprises:
   (i) a heat exchanger that regulates a temperature of the first medium by performing heat exchange between the first medium and a second medium via the heat exchanger;
   (ii) a first temperature sensor configured to detect a temperature of the first medium flowing out from a primary side outlet of the heat exchanger;
   (iii) a second temperature sensor configured to detect a temperature of the first medium flowing into a primary side inlet of the heat exchanger;
   (iv) a third temperature sensor configured to detect a temperature of the second medium flowing into a secondary side inlet of the heat exchanger;
   (v) a fourth temperature sensor configured to detect a temperature of the second medium flowing out from a secondary side outlet of the heat exchanger;
   (vi) a regulating operation unit configured to generate a flow rate regulating signal so that the temperature of the first medium flowing out from the primary side outlet becomes equal to a target temperature;
   (vii) a control valve configured to regulate a flow rate of the second medium based on the flow rate regulating signal; and
   (viii) a correcting operation unit configured (a) to calculate, based on temperatures detected by the first temperature sensor, the second temperature sensor, the third temperature sensor, and the fourth temperature sensor, a heat exchange amount of the heat exchanger, a logarithmic mean temperature difference or an average temperature in the heat exchanger, and the flow rate of the second medium, (b) to calculate an overall heat transfer coefficient of the heat exchanger based on the calculated heat exchange amount and either the calculated logarithmic mean temperature difference or the calculated average temperature, (c) to obtain a ratio of a change in the heat exchange amount to a change in the flow rate of the second medium based on the calculated flow rate of the second medium and the calculated overall heat transfer coefficient, and (d) to output the obtained ratio to the regulating operation unit to correct a gain of the regulating operation unit.

9. An exposure apparatus according to claim 8, wherein the unit, of which the temperature is regulated via the first medium, includes an actuator.

10. A method of manufacturing a device, the method comprising:
- (a) exposing a substrate to radiant energy using an exposure apparatus for exposing a substrate to light, the exposure apparatus comprising a temperature regulating apparatus, and a unit of which temperature is regulated via a first medium, of which temperature is regulated by the temperature regulating apparatus;
- (b) developing the exposed substrate; and
- (c) processing the developed substrate to manufacture the device, wherein the temperature regulating apparatus comprises:
- (i) a heat exchanger that regulates a temperature of a first medium by performing heat exchange between the first medium and a second medium via the heat exchanger;
- (ii) a first temperature sensor configured to detect a temperature of the first medium flowing out from a primary side outlet of the heat exchanger;
- (iii) a second temperature sensor configured to detect a temperature of the first medium flowing into a primary side inlet of the heat exchanger;
- (iv) a third temperature sensor configured to detect a temperature of the second medium flowing into a secondary side inlet of the heat exchanger;
- (v) a fourth temperature sensor configured to detect a temperature of the second medium flowing out from a secondary side outlet of the heat exchanger;
- (vi) a regulating operation unit configured to generate a flow rate regulating signal so that the temperature of the first medium flowing out from the primary side outlet becomes equal to a target temperature;
- (vii) a control valve configured to regulate a flow rate of the second medium based on the flow rate regulating signal; and
- (viii) a correcting operation unit configured (a) to calculate, based on temperatures detected by the first temperature sensor, the second temperature sensor, the third temperature sensor, and the fourth temperature sensor, a heat exchange amount of the heat exchanger, a logarithmic mean temperature difference or an average temperature in the heat exchanger, and the flow rate of the second medium, (b) to calculate an overall heat transfer coefficient of the heat exchanger based on the calculated heat exchange amount and either the calculated logarithmic mean temperature difference or the calculated average temperature, (c) to obtain a ratio of a change in the heat exchange amount to a change in the flow rate of the second medium based on the calculated flow rate of the second medium and the calculated overall heat transfer coefficient, and (d) to output the obtained ratio to the regulating operation unit to correct a gain of the regulating operation unit.

* * * * *